United States Patent
Yamaguchi

(10) Patent No.: US 11,360,381 B2
(45) Date of Patent: Jun. 14, 2022

(54) SUPPORT FRAME FOR PELLICLES, PELLICLE, AND METHOD FOR MANUFACTURING SAME

(71) Applicant: NIPPON LIGHT METAL COMPANY, LTD., Tokyo (JP)

(72) Inventor: Takayuki Yamaguchi, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 410 days.

(21) Appl. No.: 16/334,627

(22) PCT Filed: Aug. 29, 2017

(86) PCT No.: PCT/JP2017/030943
§ 371 (c)(1),
(2) Date: Mar. 19, 2019

(87) PCT Pub. No.: WO2018/055994
PCT Pub. Date: Mar. 29, 2018

(65) Prior Publication Data
US 2021/0011371 A1   Jan. 14, 2021

(30) Foreign Application Priority Data
Sep. 20, 2016 (JP) .............................. JP2016-182624

(51) Int. Cl.
*C23C 28/04* (2006.01)
*G03F 1/64* (2012.01)
(Continued)

(52) U.S. Cl.
CPC ............. *G03F 1/64* (2013.01); *B32B 15/20* (2013.01); *C23C 28/04* (2013.01); *C25D 11/08* (2013.01);
(Continued)

(58) Field of Classification Search
CPC ...... C25D 11/18–246; G03F 1/62; G03F 1/64
See application file for complete search history.

(56) References Cited

U.S. PATENT DOCUMENTS 5,667,726 A * 9/1997 Miyazaki ............ C03C 17/3405
516/99
2007/0178317 A1 * 8/2007 Kodaira ................ C03C 17/366
428/432
(Continued)

FOREIGN PATENT DOCUMENTS

JP         63262651 A  * 10/1988  ............... G03F 1/62
JP         2001172795 A *  6/2001

OTHER PUBLICATIONS

Machine translation of JP 2001/172795 A, obtained from EspaceNet (Year: 2021).*

*Primary Examiner* — Z. Jim Yang
(74) *Attorney, Agent, or Firm* — Rankin, Hill & Clark LLP

(57) ABSTRACT

Provided are: a support frame for pellicle that has both low dust generation property and high light resistance, and further has an ion elution amount which is reduced to the utmost limit to an extent that haze is not generated even when a short wavelength laser is used for exposure light source, a pellicle using the support frame for pellicle, and a method for efficiently manufacturing the support frame for pellicle, support frame for pellicle which comprises a frame member comprising aluminum or aluminum alloy and an inorganic coating layer formed on the surface of the frame member, wherein the main chain of the inorganic coating layer is constituted by a —Si—O—Si—O— bond. An anodized film is preferably formed between the frame member and the inorganic coating layer.

9 Claims, 2 Drawing Sheets

(51) Int. Cl.
 *C25D 11/08* (2006.01)
 *C25D 11/22* (2006.01)
 *G03F 1/84* (2012.01)
 *G03F 7/20* (2006.01)
 *B32B 15/20* (2006.01)

(52) U.S. Cl.
 CPC .............. *C25D 11/22* (2013.01); *G03F 1/84* (2013.01); *G03F 7/70983* (2013.01)

(56) References Cited

U.S. PATENT DOCUMENTS

| | | | |
|---|---|---|---|
| 2007/0292775 A1* | 12/2007 | Hamada | B29C 37/0075 |
| | | | 430/5 |
| 2015/0205195 A1* | 7/2015 | Yamaguchi | C25D 11/16 |
| | | | 428/472.2 |
| 2016/0186654 A1* | 6/2016 | Takagishi | C25D 11/246 |
| | | | 123/668 |
| 2016/0259239 A1* | 9/2016 | Yamaguchi | G03F 1/64 |
| 2017/0121839 A1* | 5/2017 | Yamashita | C25D 11/246 |
| 2018/0057639 A1* | 3/2018 | Yamashita | C25D 11/243 |
| 2018/0057954 A1* | 3/2018 | Yamashita | C25D 11/243 |
| 2018/0239242 A1* | 8/2018 | Kohmura | G03F 1/64 |
| 2020/0072159 A1* | 3/2020 | Cromme | C25D 11/04 |

* cited by examiner

SUPPORT FRAME FOR PELLICLES, PELLICLE, AND METHOD FOR MANUFACTURING SAME

TECHNICAL FIELD

The present invention relates to a support frame for pellicle which can prevent adhesion of foreign matters to a photomask or a reticle used in a lithography process in the manufacturing of a semiconductor device such as an LSI or an ultra LSI and a liquid crystal panel, and a pellicle and a method for manufacturing the same. More specifically, the present invention relates to a support frame for pellicle that an ion elution amount is reduced to the utmost limit, and a pellicle and a method for manufacturing the same.

PRIOR ARTS

On the semiconductor device such as the LSI or the ultra LSI and the liquid crystal panel, a pattern can be formed by irradiating a light to a semiconductor wafer or an original plate for liquid crystal (pattern formation by lithography). Here, in the case of using an photomask to which dust adheres, since the dust absorbs and/or inverts the light, the pattern is not transferred satisfactorily (for example, deformation of the pattern or ambiguity of the edge). As a result, the quality and appearance of the semiconductor device and the liquid crystal panel are impaired, which results in decrease in performance and manufacturing yield.

For this reason, the lithography process is usually performed in a clean room, but, since adhesion of dust to the photomask cannot be completely prevented even under such environment, usually a pellicle for protecting from dust is provided on the surface of the photomask. Pellicle is composed of a pellicle frame and a pellicle film stretched over the pellicle frame and is placed so as to surround a pattern area formed on the surface of the photomask. When the focal point is set on the pattern of the photomask at the time of lithography, even if dust adheres to the pellicle film, the dust will not affect the transfer.

Recently, the pattern of the LSI has been rapidly advanced to fineness, and accordingly, a wavelength of the exposure light source has been shortened. Specifically, the wavelength has transited from g-line (wavelength: 436 nm) and i-line (wavelength: 365 nm) of a mercury lamp to KrF excimer laser (wavelength: 248 nm), ArF excimer laser (wavelength: 193 nm), F2 excimer laser (wavelength: 157 nm) and the like.

Since these short wavelength exposure light sources have high output and high energy of light, when an inorganic acid such as sulfuric acid or phosphoric acid remains on the anodized film formed on the surface of the aluminum material which forms the pellicle, there is a problem that a reaction product (haze) such as ammonium sulfate which is produced by reacting with a residual basic substance such as ammonia, and the reaction product causes clouding in the pellicle, which affects the pattern transferred image.

With respect to the problem, for example, Patent Literature 1 (JP 2010-237282 A) discloses a method for manufacturing a support frame for pellicle which is used as a pellicle having an optical thin film body. The support frame is formed by an aluminum material including aluminum or aluminum alloy, and in the method, an anodized film is formed on a surface of the aluminum material by anodizing treatment with an alkaline aqueous solution containing tartaric acid, and the anodized film is subjected to dyeing treatment with an organic dye, and then is subjected to sealing treatment by steam to obtain a support frame for pellicle.

In the method for manufacturing the support frame for pellicle described in the above Patent Literature 1, by using the alkaline aqueous solution containing tartaric acid to anodize the aluminum material without using sulfuric acid which is the maximum causative substance of haze, it is said that there can be obtained a support frame for pellicle which can reduce the generation of haze as much as possible while having excellent corrosion resistance and durability.

In addition, Patent Literature 2 (JP H07-43892 A) discloses a pellicle characterized in that a side surface or an entire surface of a pellicle frame is coated with a paint by an electrodeposition coating method.

In the pellicle described in Patent Literature 2, since the side surface or the entire surface of the pellicle frame is coated with the paint by the electrodeposition coating method, it is said that the coating film is not uneven like the alumite layer or porous, but is uniform and smooth, and thus, it is possible to completely prevent dust generation due to transportation and movement of the pellicle.

CITATION LIST

Patent Literature

Patent Literature 1: JP 2010-237282 A
Patent Literature 2: JP H07-43892 A

SUMMARY OF INVENTION

Technical Problem

However, even in the support frame for pellicle obtained according to the manufacturing method of the support frame for pellicle described in Patent Literature 1, it is impossible to completely inhibit the elution of ions, and with regard to the formation of a fine pattern which is required in the recent semiconductor manufacturing and the like, further reduction of ion elution amount is required.

Also with regard to the pellicle described in Patent Literature 2, it is necessary to add anions such as acetic acid and lactic acid for pH adjustment or the like in the manufacturing process. Since the anion remains in the coating film due to the addition, there is a limit to the reduction of the ion elution amount as the whole of the pellicle.

Considering the above problems in the prior arts, an object of the present invention is to provide a support frame for pellicle that has both low dust generation property and high light resistance, and further has an ion elution amount which is reduced to the utmost limit to an extent that haze is not generated even when a short wavelength laser is used for an exposure light source, a pellicle using the support frame for pellicle, and a method for efficiently manufacturing the support frame for pellicle.

Solution to Problem

As a result of extensive study with respect to the support frame for pellicle, a pellicle using the support frame for pellicle, and a method for efficiently manufacturing the support frame for pellicle in order to achieve the above object, the present inventors have found that formation of the specific inorganic coating layer on the support frame for pellicle, or formation of an anodized film on the support frame for pellicle and then formation of the specific inorganic coating layer on the surface of the anodized film is extremely effective, the present invention has been completed.

Namely, the present invention provides a support frame for pellicle which comprises:

a frame member comprising aluminum or aluminum alloy and an inorganic coating layer formed on the surface of the frame member, wherein the main chain of the inorganic coating layer is constituted by a —Si—O—Si—O— bond.

In the support frame for pellicle of the present invention, since an inorganic coating having a very small ion elution amount is used for the surface treatment, not electrodeposition coating or the like, an anion elution amount can be reduced to the utmost limit. In addition, since the coating layer is a hard inorganic coating layer (inorganic polymer) where the main chain is composed of —Si—O—Si—O— bonds, excellent durability against temperature rise and laser irradiation and the like can be obtained, and generate of dust due to deterioration or the like cannot be happened.

For example, while a melting point of a fluororesin is 150 to 330° C., the inorganic coating layer of the support frame for pellicle of the present invention does not melt and decompose to about 500° C. The main chain of the fluororesin has a —C—C— bond and is cleaved by irradiation of ultraviolet rays or the like. On the other hand, the —Si—O—Si—O— bond of the inorganic coating layer of the support frame for pellicle of the present invention is not cleaved by irradiation of ultraviolet rays or laser, and has excellent durability.

Further, in the support frame for pellicle of the present invention, it is preferable to include the frame member including aluminum or aluminum alloy, an anodized film formed on the surface of the frame member, and the inorganic coating layer formed on the surface of the anodized film.

By forming the anodized film between the frame member including aluminum or aluminum alloy and the inorganic coating layer, it is possible to improve the mechanical properties such as hardness in the vicinity of the surface of the support frame for pellicle, and also it is easy to be blackened.

In the support frame for pellicle of the present invention, it is preferable that a lightness index *L value is 50 or less. When the lightness index *L value (lightness index by Hunter's color difference formula) of the support frame for pellicle is 50 or less by blackening, it is easy to prevent scattering of exposure light and to perform a foreign particle non-adhesion inspection before use.

For blackening of the support frame for pellicle, for example, though there can be used dyeing, pigmentation, natural coloring, electrolytic coloring or the like, in the case of using an organic dye, when high energy light is irradiated on the support frame for pellicle, there is a possibility that color tone change and discoloration may occur due to chemical change of the organic dye. Therefore, from the viewpoint of obtaining light resistance, it is preferable to use the pigmentation, natural coloring, electrolytic coloring and the like.

Furthermore, in the support frame for pellicle of the present invention, it is preferable that, in ion elution test for measuring a concentration of ion eluted by immersing the frame in pure water at 80° C. for 4 hours, elution concentration of acetate ion to 100 ml of pure water per 100 cm² of the surface area is 0.2 ppm or less, elution concentration of formate ion is 0.2 ppm or less, elution concentration of oxalate ion is 0.2 ppm or less, elution concentration of sulfate ion is 0.1 ppm or less, elution concentration of nitrate ion is 0.2 ppm or less, elution concentration of nitrite ion is 0.2 ppm or less, elution concentration of chlorine ion is 0.2 ppm or less, and elution concentration of phosphate ion is 0.1 ppm or less. By inhibiting the ion elution amount of the support frame for pellicle to these values, the haze generation during lithography can be substantially completely suppressed.

Further, the present invention provides a method for manufacturing a support frame for pellicle, which comprises a step for applying an inorganic coating on a surface of a frame member comprising aluminum or aluminum alloy, and an inorganic coating agent having the molecular structure of:

[Chemical formula 1]

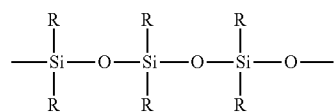

wherein R is a hydrocarbon group is used for the inorganic coating.

By using the inorganic pore-sealing agent having the above molecular structure as the inorganic coating, it is possible to easily and efficiently form the inorganic coating layer (inorganic polymer) where the main chain is composed of the —Si—O—Si—O— bond on the surface of the support frame for pellicle.

More specifically, the inorganic coating layer can be formed by, after the inorganic pore-sealing agent having the above molecular structure is coated or impregnated on the surface of the support frame for pellicle and stabilized, baking at an appropriate temperature. Though the side chain Si—C bond and the like are cleaved by the baking treatment, since the —Si—O—Si—O— bond of the main chain is maintained, it is possible to easily and efficiently obtain the inorganic coating layer having high durability and heat resistance.

Also, in the manufacturing method of the support frame for pellicle, it is preferable to include:

a first step for subjecting the frame member comprising aluminum or aluminum alloy to an anodizing treatment, and a second step for applying the inorganic coating to the surface of an anodized film formed by the anodizing treatment, wherein the inorganic coating agent is used for the inorganic coating.

By forming the anodized film on the surface of the frame member and then applying the inorganic coating, it is possible to improve the mechanical properties such as hardness in the vicinity of the surface of the support frame for pellicle, and also it is possible to perform the blackening during the anodizing treatment step.

In the method of manufacturing the support frame for pellicle of the present invention, it is preferable to further include a coloring step for adjusting a lightness index *L value by at least one of pigmentation, natural coloring and electrolytic coloring. When lowering the lightness index *L value by the coloring step, it is possible to obtain the support frame for pellicle which can easily prevent scattering of exposure light and perform a foreign particle non-adhesion inspection before use, and the like. Here, from the viewpoints of prevention of scattering of exposure light and performing of the foreign particle non-adhesion inspection before use, it is preferable to adjust the lightness index *L value to 50 or less by blackening.

The present invention also provides a pellicle which includes:

the support frame for pellicle of the present invention, and
a pellicle film supported by the support frame for pellicle.

Since the support frame for pellicle of the present invention has both low dust generation property and high light resistance, and further has an ion elution amount which is reduced to the utmost limit, the pellicle of the present invention using the support frame for pellicle of the present invention, it can be suitably used for lithography using a short wavelength laser as an exposure light source.

Effects of the Invention

According to the present invention, it is possible to provide a support frame for pellicle that has both low dust generation property and high light resistance, and further has an ion elution amount which is reduced to the utmost limit to an extent that haze is not generated even when a short wavelength laser is used for an exposure light source, a pellicle using the support frame for pellicle, and a method for efficiently manufacturing the support frame for pellicle.

EMBODIMENTS FOR ACHIEVING THE INVENTION

Hereinafter, representative embodiments of the support frame for pellicle, the pellicle and the manufacturing method thereof according to the present invention will be described in detail with reference to the drawings, but the present invention is not limited to only these examples. In the following description, the same or equivalent parts are denoted by the same numerals, and there is a case that redundant explanation may be omitted. In addition, since the drawings are for conceptually explaining the present invention, dimensions of the respective constituent elements expressed and ratios thereof may be different from actual ones.

1. Support Frame for Pellicle

Figure 1:
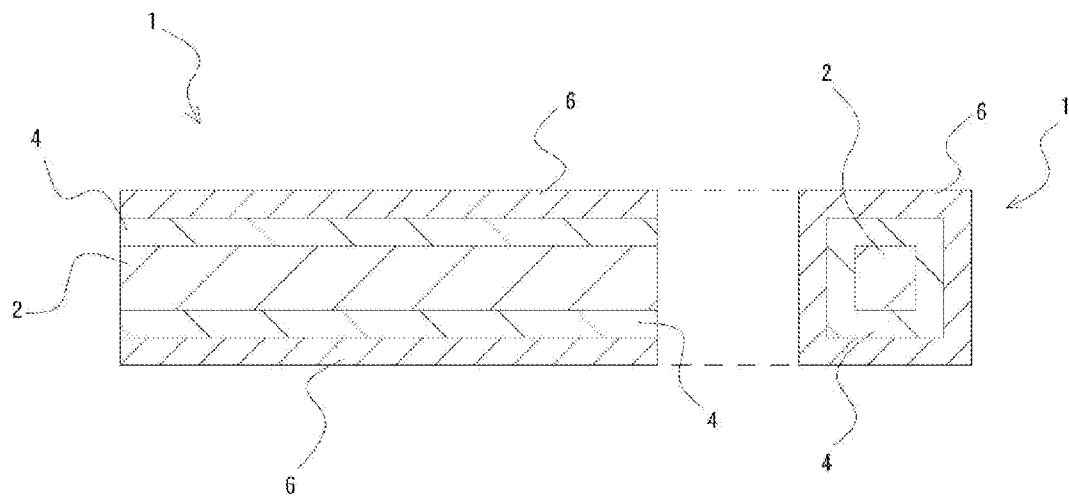
FIG. 1 is a schematic cross-sectional view showing the support frame for pellicle of the present invention.

FIG. 1 shows a schematic cross-sectional view of the support frame for pellicle of the present invention. In the support frame 1 for pellicle, an anodized film 4 is formed on the surface of the frame member 2, and an inorganic coating layer 6 is formed on the surface of the anodized film 4. In the support frame 1 for pellicle shown in FIG. 1, the anodized film 4 is formed, but the inorganic coating layer 6 may be directly formed on the frame member 2.

The frame member 2 is made of aluminum or aluminum alloy, and various conventionally known aluminum or aluminum alloys can be used as the material. Examples of the material include aluminums of 1000 series, aluminum alloys of 3000 series, aluminum alloys of 5000 series, aluminum alloys of 6000 series, aluminum alloys of 7000 series, Al—Ca alloys, and the like.

Examples of the aluminum of 1000 series include A1050, A1050A, A1070, A1080, A1085, A1100, A1200, A1N00 and A1N30 described in the JIS standard, examples of the aluminum alloy of 3000 series include A3003, A3103, A3203, A3004, A3104, A3005 and A3105 described in the JIS standard, examples of the aluminum alloy of 5000 series include A5005, A5N01, A5021, A5N02 and A5042 described in the JIS standard, examples of the aluminum alloy of 6000 series include A6101, A6003, A6005, A6N01, A6151 and A6063 described in the JIS standard, and examples of the aluminum alloy of 7000 series include A7001, A7003, A7005, A7010, A7020, A7049, A7050, A7075, A7090, A7091, A7178, A7475 and A7N01.

Further, the Al—Ca alloy is not particularly limited as long as the effects of the present invention are not impaired, and various conventionally known Al—Ca alloys can be used, but, according to the crystal structure, crystal particle size, shape control, and the like of the $Al_4Ca$ crystal, it is preferable to use Al—Ca alloys having excellent rolling processability.

In addition, the method for manufacturing the frame member 2 is not particularly limited, and various conventionally known methods for manufacturing aluminum or aluminum alloy members can be used. As the frame member 2, for example, one obtained by processing a powder sintered body as a hot extruded material, or one obtained by subjecting an aluminum alloy ingot to plastic-working can be used. Further, heat treatment may be appropriately performed, if necessary.

The shape of the support frame 1 for pellicle is not particularly limited as long as the effects of the present invention are not impaired and can be various conventionally known shapes according to the shape of the photomask, but, in general, the plane shape of the support frame 1 for pellicle is a ring shape, a rectangular shape or a square shape and has a size and shape to cover the circuit pattern portion provided on the photomask. In addition, the support frame 1 for pellicle may be provided with an air pressure adjustment vent, a dust removal filter for the vent, jig holes, and the like.

The height (thickness) of the support frame 1 for pellicle is preferably 0.5 to 10 mm, more preferably 1 to 7 mm, and most preferably approximately 1.5 mm. By setting the height (thickness) of the support frame 1 for pellicle to these values, the distortion of the support frame 1 for pellicle can be inhibited, and good handling property can be ensured.

The cross-sectional shape of the support frame 1 for pellicle is not particularly limited as long as the effects of the present invention are not impaired and can be various conventionally known shapes, but it is preferable that the cross-sectional shape is a quadrilateral in which the upper side and the lower side are parallel. There are required a width for mounting the pellicle film is required on the upper side of the support frame 1 for pellicle and a width for adhering to the photomask by providing the adhesive layer for pressure sensitive adhesion on the lower side. For this reason, the width of the upper side and the lower side of the support frame 1 for pellicle is preferably about 1 to 3 mm.

The flatness of the support frame 1 for pellicle is preferably smaller than or equal to 20 μm, more preferably smaller than or equal to 10 μm. By improving the flatness of the support frame 1 for pellicle, it is possible to reduce the distortion amount of the support frame 1 for pellicle when the pellicle 1 is attached to the photomask. The flatness of the support frame 1 for pellicle is calculated by calculating a virtual plane by measuring the height at a total of 8 points including 4 corners of the support frame 1 for pellicle and 4 central points of the four sides, and then calculating from the difference obtained by subtracting the lowest point from the highest point among the distances of each point.

The film quality and the like of the anodized film 4 are not particularly limited as long as the effects of the present invention are not impaired and various conventionally known anodized films can be used, but preferable is one that is formed by anodizing the frame member 2 in an alkaline bath. For example, when an anodizing treatment is performed by using a sulfuric acid bath, an inorganic acid such as sulfuric acid or acetic acid remains on the anodized film 4 on the surface of the aluminum member (frame member 2) due to the bath, and this acid reacts with a basic substance such as ammonia existing in the exposure atmosphere to produce a reaction product (haze) such as ammonium sulfate, and then the reaction product (haze) causes clouding in the pellicle to affect the pattern transferred image. On the other hand, by using the alkaline bath for the anodizing treatment, it is possible to prevent the remaining of the inorganic acid which forms the reaction product (haze).

The thickness of the anodized film 4 is not particularly limited as long as the effects of the present invention are not impaired, but it is preferably 1 to 15 μm. When the film thickness is 1 μm or more, a homogeneous anodized film 4 can be formed, and when being 15 μm or less, it is possible to suppress the decrease in strength of the anodized film 4.

The inorganic coating layer 6 formed on the surface of the anodized film 4 has the main chain composed of —Si—O—Si—O— bond. Since the —Si—O—Si—O— bond is difficultly cleaved by heat or irradiation of a short wavelength laser having high energy, the inorganic coating layer 6 has excellent heat resistance and light resistance. In addition, the inorganic coating layer 6 composed of the strong bond has sufficient hardness and low dust generation property.

In the case of the electrodeposition coating, since, during this step, an anion (negative ion) such as acetic acid or lactic acid is added for adjusting pH or the like, the anion (negative ion) remains in the coating film, but, in the formation of the inorganic coating layer 6, since an anion (negative ion) is not necessarily added, it is possible to suppress the remaining of the anion (negative ion).

In the support frame 1 for pellicle, the lightness index *L value is preferably 50 or less. When the lightness index *L value (lightness index by Hunter's color difference formula) of the support frame 1 for pellicle is 50 or less by blackening, it is easy to prevent scattering of exposure light and to perform a foreign particle non-adhesion inspection before use.

For blackening of the support frame 1 for pellicle, for example, though there can be used dyeing, pigmentation, natural coloring, electrolytic coloring or the like, in the case of using an organic dye, when high energy light is irradiated on the support frame for pellicle, there is a possibility that color tone change and discoloration may occur due to chemical change of the organic dye. Therefore, from the viewpoint of obtaining light resistance, it is preferable to use the pigmentation, natural coloring, electrolytic coloring and the like.

As described above, since the inorganic acid is prevented from remaining in the anodized film 4 and the inorganic coating layer 6, the elution of the anions (negative ions) from the pellicle support frame 1 for pellicle is extremely small. Here, it is preferable that, in the ion elution test for measuring concentration of an ion eluted by immersing the support frame 1 for pellicle in pure water at 80° C. for 4 hours, elution concentration of acetate ion to 100 ml of pure water per 100 $cm^2$ of the surface area is 0.2 ppm or less, elution concentration of formate ion is 0.2 ppm or less, elution concentration of oxalate ion is 0.2 ppm or less, elution concentration of sulfate ion is 0.1 ppm or less, elution concentration of nitrate ion is 0.2 ppm or less, elution concentration of nitrite ion is 0.2 ppm or less, elution concentration of chlorine ion is 0.2 ppm or less, and elution concentration of phosphate ion is 0.1 ppm or less. By inhibiting the ion elution amount of the support frame 1 for pellicle to these values, the haze generation during lithography can be substantially completely suppressed. Particularly, by controlling the elution amounts of acetate ion, formate ion, sulfate ion, oxalate ion and nitrite ion, the generation of the haze can be lowered to the utmost.

2. Method for Manufacturing Support Frame for Pellicle

The method for manufacturing the support frame for pellicle of the present invention includes a first step (S01) for subjecting the frame member 2 comprising aluminum or aluminum alloy to an anodizing treatment, and a second step (S02) for applying the inorganic coating to the surface of an anodized film 4 formed by the anodizing treatment. Note that the first step (S01) for the anodizing treatment may be omitted and the second step (S02) may be directly applied to the frame member 2. In the following, each step will be described in detail.

(1) First Step (S01: Anodizing Treatment)

The first step (S01) is a step for subjecting the frame member 2 comprising aluminum or aluminum alloy to the anodizing treatment to form the anodized film 4. The conditions of the anodizing treatment are not particularly limited as long as the effects of the present invention are not impaired, and various conventionally known anodizing treatments can be used, but it is preferable to perform the treatment in the alkaline bath.

With respect to the anodizing treatment, more specifically, it is preferable that the anodizing treatment is performed in i) an inorganic alkaline bath which contains one or more inorganic alkaline components selected from the group consisting of sodium hydroxide, potassium hydroxide, lithium hydroxide, calcium hydroxide, strontium hydroxide and rubidium hydroxide, or in ii) an alkaline mixed bath which contains one or more organic acids selected from the group consisting of tartaric acid, citric acid, oxalic acid and salicylic acid or a component having a carboxyl group, and one or more inorganic alkaline components selected from the group consisting of sodium hydroxide, potassium hydroxide, lithium hydroxide, calcium hydroxide, strontium hydroxide and rubidium hydroxide.

Here, in the case of using the inorganic alkaline bath containing the inorganic alkaline component of i) as the alkaline bath, since any acid component is not contained, there is almost no case that an intermetallic compound other than Al is dissolved during anodizing. With respect to the inorganic alkaline component, from the viewpoint of versatility, it is preferable to use sodium hydroxide or potassium hydroxide. Furthermore, considering the formation rate of the anodized film and the like, the pH of the alkaline aqueous solution (inorganic alkaline bath) is preferably 12 to 14, more preferably 12.5 to 13.5.

The treatment conditions for the anodizing treatment when the inorganic alkaline bath is used may be appropriately adjusted according to the film thickness, characteristics, processing time, and the like of the anodized film 4 to be formed, and the voltage is 0.5 to 20 V, more preferably 1 to 20 V, and most preferably 3 to 17 V. By performing the anodized film treatment in a relatively low voltage range as described above, depending on the material of the frame member 2 (for example, in the case where an intermetallic compound such as MgZn$_2$ exists in the Al base material), a blackened anodized film can be obtained. On the other hand, by setting the voltage to 1 V or more, it is possible to stably form the anodized film 4. In the case of coloring by a dyeing method, the voltage is preferably 0.5 V to 80 V, more preferably 1 to 70 V, and most preferably 10 to 50 V.

Further, when subjecting the anodizing treatment, the bath temperature is preferably 0 to 20° C., more preferably 0 to 15° C., and most preferably 5 to 10° C. When the bath temperature is lower than 0° C., not only the formation rate of the coating film is slow and the efficiency becomes bad, but also there is a possibility that the electrolytic solution is frozen and normal electrolysis cannot be performed. On the other hand, when the temperature is higher than 20° C., since the rate of dissolution of the coating film is increased, the film formed spontaneously dissolves in the electrolytic solution and there is a possibility that appearance such as powder blowing may occur. The treatment time of the anodizing treatment is preferably 1 to 120 minutes, more preferably 5 to 90 minutes.

As described above, in the case i) where the inorganic alkaline bath is used, since the organic acid or inorganic acid is not contained in the anodizing bath, not only management of the electrolytic solution is easy, but also there are no components decomposed by irradiation of various lasers. As a result, it is possible to give excellent light resistance to the support frame 1 for pellicle and to suppress generation of the haze or the like to the utmost.

On the other hand, in the case ii) where the alkaline mixed bath which contains the organic acid and the inorganic alkaline component is used, in addition to blackening with an intermetallic compound such as MgZn$_2$, the coloring occurs by taking the organic component into the anodized film. From the viewpoints of light resistance, occurrence of haze and the like, it is preferable to use the aforementioned organic acid as the target organic acid.

As the tartaric acid, tartaric acid salts such as sodium tartrate, potassium tartrate, potassium sodium tartrate and ammonium tartrate can be suitably used. The concentration of the tartaric acid salt is preferably 0.1 to 200 g/L, and more preferably 1 to 150 g/L. When the concentration of the tartaric acid salt is lower than 0.1 g/L, it is difficult to form the anodized film, and when more than 200 g/L, there is a possibility that the tartaric acid salt precipitates during the anodizing treatment. The pH of the alkaline aqueous solution (alkaline mixed bath) containing the tartaric acid salt and the inorganic alkaline component is preferably 12 to 14, more preferably 12.5 to 13.0.

Further, as the citric acid, citric acid salts such as sodium citrate, potassium citrate, lithium citrate and ammonium citrate can be suitably used. The concentration of the citric acid salt is preferably 0.1 to 300 g/L, and more preferably 1 to 200 g/L. The pH of the alkaline aqueous solution (alkaline mixed bath) containing the citric acid salt and the inorganic alkaline component is preferably 12 to 14, more preferably 12.5 to 13.5.

Further, as the oxalic acid, oxalic acid salts such as sodium oxalate, potassium oxalate and ammonium oxalate can be suitably used. The concentration of the oxalic acid salt is preferably 0.1 to 350 g/L, and more preferably 1 to 300 g/L. The pH of the alkaline aqueous solution (alkaline mixed bath) containing the oxalic acid salt and the inorganic alkaline component is preferably 12 to 14, more preferably 12.5 to 13.5.

Furthermore, as the salicylic acid, salicylic acid salts such as sodium salicylate, potassium salicylate and ammonium salicylate can be suitably used. The concentration of the salicylic acid salt is preferably 0.1 to 500 g/L, and more preferably 1 to 400 g/L. The pH of the alkaline aqueous solution (alkaline mixed bath) containing the salicylic acid salt and the inorganic alkaline component is preferably 12 to 14, more preferably 12.5 to 13.5.

It is preferable to use a relatively low voltage of 2 to 20 V when the anodizing treatment is performed by using the alkaline mixed bath containing the organic acid salt and the inorganic alkaline component. In the case of using the alkaline mixed bath containing the tartaric acid salt and the inorganic alkaline component, the voltage is preferably 2 to 19 V, more preferably 5 to 17 V, most preferably 7 to 15 V. In the case of using the alkaline mixed bath containing the citric acid salt and the inorganic alkaline component, the voltage is preferably 2 to 19 V, more preferably 3 to 17 V, and most preferably 5 to 15 V. In the case of using the alkaline mixed bath containing the oxalic acid salt and the inorganic alkaline component, the voltage is preferably 2 to 19 V, more preferably 3 to 17 V, and most preferably 5 to 15 V. In the case of using the alkaline mixed bath containing the salicylic acid salt and the inorganic alkaline component, the voltage is preferably 3 to 19 V, more preferably 5 to 17 V, and most preferably 7 to 15 V.

Further, the quantity of electricity during the anodizing treatment is preferably 3 to 50 C/cm$^2$, more preferably 5 to 30 C/cm$^2$ in the case i) of using the inorganic alkaline bath. In the case of using the alkaline mixed bath containing the tartaric acid salt and the inorganic alkaline component, the quantity of electricity is preferably 3 to 50 C/cm$^2$, more preferably 5 to 30 C/cm$^2$. In the case of using the alkaline mixed bath containing the citric acid salt and the inorganic alkaline component, the quantity of electricity is preferably 3 to 50 C/cm$^2$, more preferably 5 to 30 C/cm$^2$. In the case of using the alkaline mixed bath containing the oxalic acid salt and the inorganic alkaline component, the quantity of electricity is preferably 3 to 50 C/cm$^2$, more preferably 5 to 30 C/cm$^2$. In the case of using the alkaline mixed bath containing the salicylic acid salt and the inorganic alkaline component, the quantity of electricity is preferably 5 to 70 C/cm$^2$, more preferably 7 to 50 C/cm$^2$.

The bath temperature of the alkaline mixed bath is, as in the case i) of using the inorganic alkaline bath, preferably 0 to 20° C., more preferably 0 to 15° C., and most preferably 5 to 10° C. The treatment time of the anodizing treatment is preferably 5 to 40 minutes, more preferably 7 to 20 minutes.

(2) Second Step (S02: Inorganic Coating Treatment)

The second step (S02) is a step for applying the inorganic coating to the surface of the anodized film 4 formed by the anodizing treatment.

For the inorganic coating to be applied in the second step (S02), an inorganic coating agent having the molecular structure:

[Chemical formula 2]

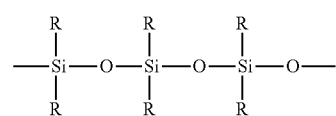

wherein R is a hydrocarbon group is used.

By using the inorganic coating agent having the above molecular structure as the inorganic coating, it is possible to easily and efficiently form the inorganic coating layer 6 where the main chain is composed of the —Si—O—Si—O— bond on the outermost surface of the support frame 1 for pellicle.

More specifically, the inorganic coating layer 6 can be formed by, after the inorganic coating agent having the above molecular structure is coated or impregnated on the surface of the anodized film 4 formed on the surface of the frame member 2 and stabilized, baking at an appropriate temperature. Though the side chain Si—C bond and the like are cleaved by the baking treatment, since the —Si—O—Si—O— bond of the main chain is maintained, it is possible to easily and efficiently obtain the inorganic coating layer 6 having high durability and heat resistance. As a method for applying the inorganic coating agent, for example, a spraying method, a spin coating method, or the like can be used.

The conditions of the baking treatment are not particularly limited as long as the effects of the present invention are not impaired and may be appropriately adjusted according to the desired thickness, film quality and the like of the inorganic coating layer 6, but the baking temperature is 30 to 200° C., more preferably 50 to 180° C. When setting the baking temperature to 50° C. or higher, it is possible to shorten the curing time while ensuring good adhesion between the substrate and the coating film, and when setting to 200° C. or lower, it is possible to keep the adhesion between the substrate and the coating film. The baking time is preferably 10 to 180 minutes, more preferably 30 to 120 minutes. When setting the baking time to 10 minutes or more, it is possible to stably cure the coating film, and when setting to 180 minutes or less, it is possible to easily deal with mass production while maintaining the performance of the coating film.

For the inorganic coating, the inorganic pore-forming agent having the above molecular structure may be used, and for example, an inorganic pore-forming agent "Permeate" available from Day & Day Co., Ltd. can be suitably used.

(3) Other Steps

In the method of manufacturing the support frame for pellicle of the present invention, it is preferable to further include a coloring step for adjusting a lightness index *L value by at least one of pigmentation, natural coloring and electrolytic coloring. The coloring method using pigmentation, natural coloring and electrolytic coloring is not particularly limited as long as the effects of the present invention are not impaired, and various conventionally known coloring methods can be used.

When lowering the lightness index *L value of the support frame 1 for pellicle by blackening, it is possible to obtain the support frame for pellicle which is easy to prevent scattering of exposure light and to perform a foreign particle non-adhesion inspection before use. Here, from the viewpoints of prevention of scattering of exposure light and inspection of adhesion of foreign substances before use, it is preferable to adjust the lightness index *L value to 50 or less by blackening.

For blackening of the support frame 1 for pellicle, for example, though there can be used dyeing, pigmentation, natural coloring, electrolytic coloring or the like, in the case of using an organic dye, when high energy light is irradiated on the support frame for pellicle, there is a possibility that color tone change and discoloration may occur due to chemical change of the organic dye. Therefore, from the viewpoint of obtaining light resistance, it is preferable to use the pigmentation, natural coloring, electrolytic coloring and the like.

3. Pellicle

Figure 2:
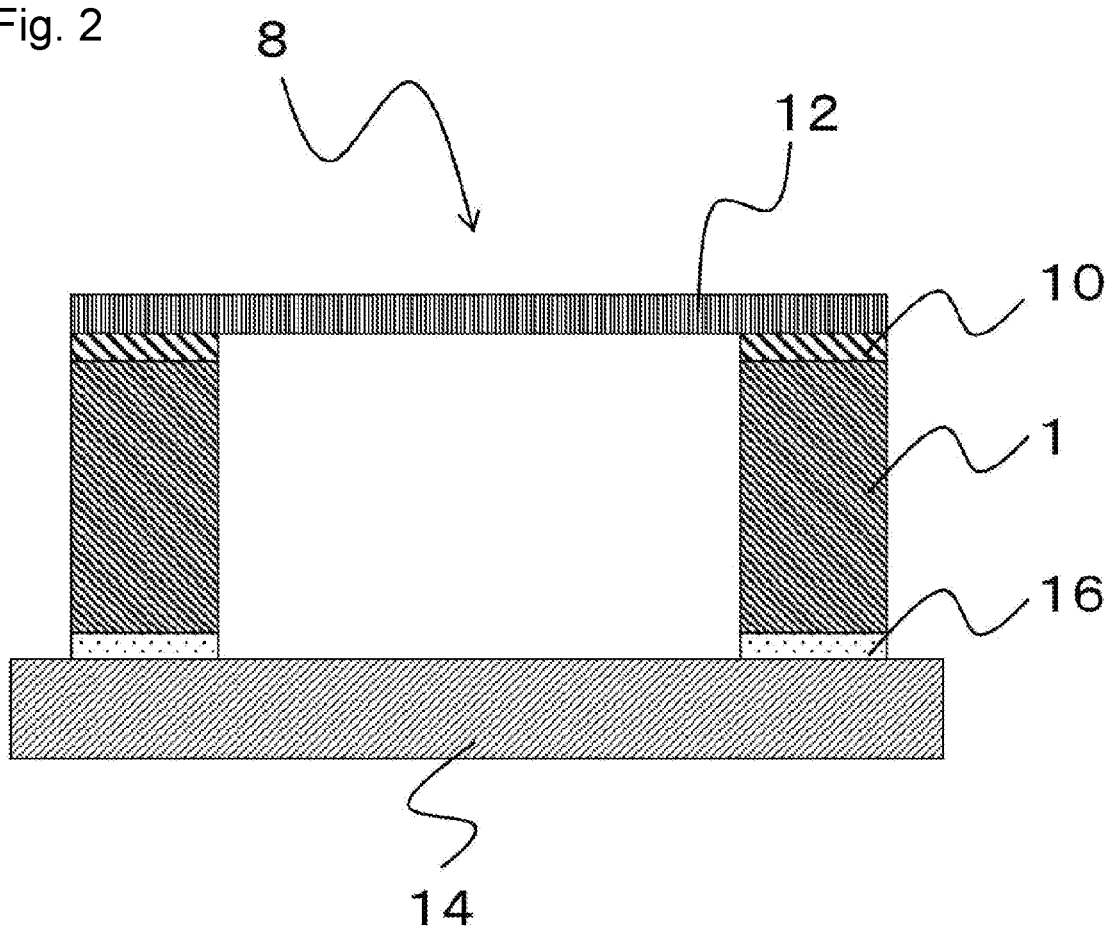
FIG. 2 is a schematic cross-sectional view showing one example of the pellicle which is composed by using the pellicle frame of the present invention.
Figure 3:
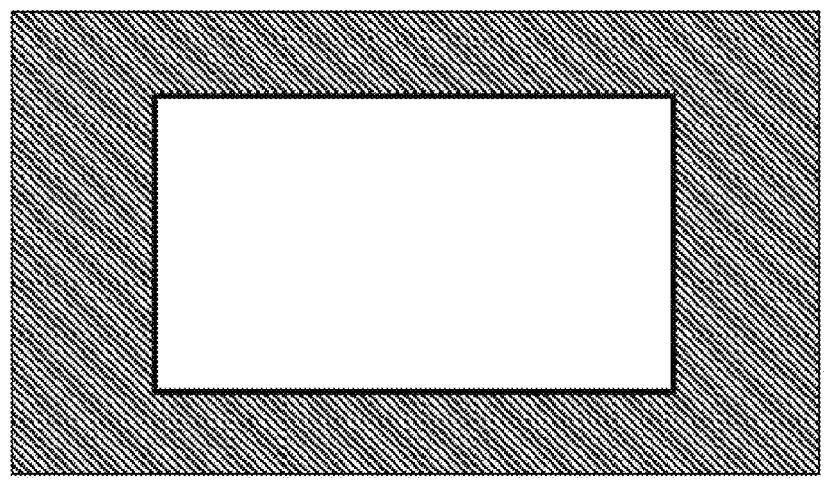
FIG. 3 is a schematic plan view showing one example of the pellicle frame of the present invention.
Figure 3:
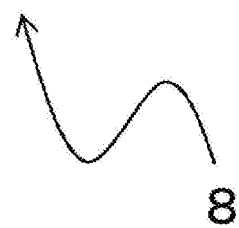

A schematic sectional view of one example of the pellicle of the present invention constituted by using the support frame for pellicle of the present invention and a schematic plan view of the support frame for pellicle of the present invention are shown in FIG. 2 and FIG. 3, respectively. The pellicle 8 is obtained by stretching and mounting a pellicle film 12 on the upper end surface of the support frame 1 for pellicle via an adhesive layer 10 for mounting the pellicle film. When using the pellicle 8, a pressure sensitive adhesive layer 16 for adhering the pellicle 8 to the photomask (mask or reticle) 14 is formed on the lower end surface of the support frame 1 for pellicle, and a liner (not shown) is peelably adhered to the lower end surface of the pressure sensitive adhesive layer 16.

The representative embodiments of the present invention have been described above, but the present invention is not limited only to these embodiments, and various design changes are possible, and all such design changes are included in the technical scope of the present invention.

EXAMPLES

Example 1

A main body of a support frame for pellicle with a frame shape having outer dimensions of 155 mm×125 mm×thickness 5 mm made of JIS A 7075 aluminum alloy (JIS A 7075-T 6) which was treated according to the temper designation T6 shown in JIS H 0001 was subjected to the anodizing treatment, and thereafter, an inorganic coating agent (Permeate 100) available from Day & Day Co., Ltd. was applied to be a thickness of about 15 μm and subjected to baking treatment to obtain a present support frame 1 for pellicle. The anodizing treatment was carried out in an anodizing bath of an alkaline aqueous solution (pH=14) where 1 wt % of sodium hydroxide (NaOH) was dissolved, at an electrolytic voltage of 20 V and at a bath temperature of 10° C. for 30 minutes. The baking treatment was carried out under the condition of 100° C. for 1 hour.

Example 2

A present support frame 2 for pellicle was obtained in the same manner as in Example 1 except that the coating thickness of the inorganic coating agent (Permeate 100) was about 30 μm.

Example 3

A present support frame 3 for pellicle was obtained in the same manner as in Example 2, except that hot water washing was performed after the baking treatment.

Example 4

A present support frame 4 for pellicle was obtained in the same manner as in Example 1 except that after the anodizing treatment, the pore-sealing treatment was performed before applying the inorganic coating agent (Permeate 100). The sealing treatment was carried out by placing in a steam sealing apparatus and keeping for 30 minutes while generating a steam having a relative humidity of 100% (RH), a pressure of 2.0 kg/cm²G, and a temperature of 130° C.

Example 5

A present support frame 5 for pellicle was obtained in the same manner as in Example 4 except that the coating thickness of the inorganic coating agent (Permeate 100) was about 30 μm.

Example 6

A present support frame 6 for pellicle was obtained in the same manner as in Example 5 except that hot water washing was performed after the baking treatment.

Example 7

A present support frame 7 for pellicle was obtained in the same manner as in Example 1 except that, without performing the anodizing treatment, an inorganic coating agent (Permeate 100) in which a carbon black was dispersed was directly applied to the main body of the support frame for pellicle.

Comparative Example 1

A main body of a support frame for pellicle with a frame shape having outer dimensions of 155 mm×125 mm×thickness 5 mm made of JIS A 7075 aluminum alloy (JIS A 7075-T 6) which was treated according to the temper designation T6 shown in JIS H 0001 was used as a comparative support frame 1 without additional treatments for pellicle.

Comparative Example 2

A main body of a support frame for pellicle with a frame shape having outer dimensions of 155 mm×125 mm×thickness 5 mm made of JIS A 7075 aluminum alloy (JIS A 7075-T 6) which was treated according to the temper designation T6 shown in JIS H 0001 was subjected to anodizing treatment with an electrolytic solution of sulfuric acid to obtain a comparative support frame 2 for pellicle. The anodizing treatment was carried out by using a 15 wt % sulfuric acid bath at 20° C. at 15 mA/cm$^2$ for 20 minutes.

[Evaluation]

The ion elution amounts of the present support frames 1 to 7 for pellicle were evaluated. Specifically, the present support frame for pellicle was placed in a polyethylene bag, 100 ml of pure water was added thereto, and then the bag was sealed to immerse the frame for 4 hours at 80° C. The extracted water from which the eluted component from the present support frame for pellicle was extracted was analyzed with an ion chromatographic analyzer (ICS-2100 available from Thermo Fisher Scientific Co., Ltd.) at 1.5 ml/minute under a cell temperature of 35° C., and a column (IonPacAS 11-HC) temperature of 40° C.

Detecting acetate ion, formate ion, hydrochloride ion, nitrite ion, nitrate ion, sulfate ion, oxalate ion and phosphate ion from the above extracted water, the elution concentrations in 100 ml of pure water per 100 cm$^2$ of the surface area of the present support frame for pellicle were obtained. The obtained results are shown in Table 1. The limit of quantitation (lower limit) of the ion chromatograph analyzer used for the evaluation varies depending on ion species, and it is 0.01 to 0.001 ppm. The unit in each numerical value in Table 1 is ppb, and "0" means that the ionic species was not quantified.

TABLE 1

| | Acetate ion | Formate ion | Chlorine ion | Nitrite ion | Nitrate ion | Sulfate ion | Oxalate ion | Phosphate ion |
|---|---|---|---|---|---|---|---|---|
| Ex. 1 | 8 | 9 | 4 | 0 | 0 | 0 | 0 | 0 |
| Ex. 2 | 8 | 8 | 6 | 0 | 4 | 1 | 0 | 0 |
| Ex. 3 | 7 | 10 | 2 | 0 | 0 | 0 | 0 | 0 |
| Ex. 4 | 41 | 16 | 3 | 1 | 1 | 0 | 1 | 0 |
| Ex. 5 | 22 | 28 | 5 | 1 | 3 | 1 | 2 | 0 |
| Ex. 6 | 1 | 22 | 3 | 1 | 1 | 0 | 1 | 0 |
| Ex. 7 | 23 | 27 | 3 | 1 | 1 | 0 | 0 | 0 |
| Com. Ex. 1 | 5 | 2 | 1 | 0 | 0 | 0 | 0 | 8 |
| Com. Ex. 2 | 4300 | 470 | 17 | 3 | 93 | 240 | 52 | 0 |

As shown in Table 1, the amounts of ion elution of the present support frames 1 to 7 for pellicle which were the support frames for pellicle of the present invention, are extremely small, and it is clear that almost no ion elution is recognized.

The lightness index *L values based on Hunter's color difference formula of the present support frames 1 to 7 for pellicle and the comparative support frames 1 to 2 for pellicle were measured. The obtained results are shown in Table 2. It is clear that the lightness index *L values of the present support frames 1 to 7 for pellicle are all 50 or less.

TABLE 2

| | Ex. 1 | Ex. 2 | Ex. 3 | Ex. 4 | Ex. 5 | Ex. 6 | Ex. 7 | Com. Ex. 1 | Com. Ex. 2 |
|---|---|---|---|---|---|---|---|---|---|
| L value | 25.2 | 24.7 | 26.1 | 25.5 | 24.3 | 23.4 | 16.8 | 73.1 | 23.1 |

EXPLANATION OF SYMBOLS

1: Support frame for pellicle,
2: Frame member,
4: Anodized film,
6: Inorganic coating layer,
8: Pellicle,
10: Adhesive layer 10 for mounting the pellicle film,
12: Pellicle film,
14: Photomask,
16: Pressure sensitive adhesive layer.

The invention claimed is:

1. A support frame for pellicle which comprises:
   a frame member comprising aluminum or aluminum alloy, and
   an inorganic coating layer formed on the surface of the frame member,
   wherein the main chain of the inorganic coating layer is constituted by a —Si—O—Si—O— bond,
   wherein, in ion elution test for measuring concentration of ion eluted by immersing the frame in pure water at 80° C. for 4 hours, elution concentration of acetate ion to 100 ml of pure water per 100 cm² of the surface area is 0.2 ppm or less, elution concentration of formate ion is 0.2 ppm or less, elution concentration of oxalate ion is 0.2 ppm or less, elution concentration of sulfate ion is 0.1 ppm or less, elution concentration of nitrate ion is 0.2 ppm or less, elution concentration of nitrite ion is 0.2 ppm or less, elution concentration of chlorine ion is 0.2 ppm or less, and elution concentration of phosphate ion is 0.1 ppm or less, and
   wherein a thickness of the inorganic coating layer is 15 µm or more and 30 µm or less.

2. The support frame for pellicle according to claim 1, which comprises:
   the frame member,
   an anodized film formed on the surface of the frame member, and
   the inorganic coating layer formed on the surface of the anodized film.

3. The support frame for pellicle according to claim 1, wherein a lightness index *L value is 50 or less by blackening.

4. The support frame for pellicle according to claim 1, wherein the frame is colored by at least one of dyeing pigmentation, natural coloring and electrolytic coloring.

5. A method for manufacturing the support frame for pellicle according to claim 1, which comprises a step for applying an inorganic coating on the surface of the frame member comprising aluminum or aluminum alloy, and an inorganic coating agent having the molecular structure of:

[Chemical formula 1]

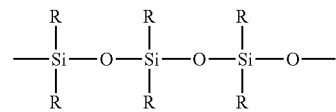

wherein R is a hydrocarbon group is used for the inorganic coating.

6. The method for manufacturing the support frame for pellicle according to claim 5, which comprises:
   a first step for subjecting the frame member comprising aluminum or aluminum alloy to an anodizing treatment, and
   a second step for applying the inorganic coating to the surface of an anodized film formed by the anodizing treatment,
   wherein the inorganic coating agent is used for the inorganic coating.

7. The method for manufacturing the support frame for pellicle according to claim 5, which further comprises:
   a coloring step for adjusting a lightness index *L value by at least one of dyeing pigmentation, natural coloring and electrolytic coloring.

8. The method for manufacturing the support frame for pellicle according to claim 5, wherein the lightness index *L value is adjusted to 50 or less by blackening.

9. A pellicle comprising
   the support frame for pellicle according to claim 1, and
   a pellicle film supported by the support frame for pellicle.

* * * * *